US012765324B2

(12) United States Patent
Chitale et al.

(10) Patent No.: US 12,765,324 B2
(45) Date of Patent: Oct. 13, 2026

(54) SHAFT MEMBERS, PROCESS KITS AND SEMICONDUCTOR PROCESSING SYSTEMS HAVING SHAFT MEMBERS, AND METHODS OF MAKING SEMICONDUCTOR PROCESSING SYSTEMS

(71) Applicant: ASM IP Holding B.V., Almere (NL)

(72) Inventors: Aniket Chitale, Phoenix, AZ (US); Felix Rabinovich, Scottsdale, AZ (US); Gary Urban Keppers, Morgan Hill, CA (US); Han Ye, Phoenix, AZ (US); Bradley Wayne Evans, Apache Junction, AZ (US); Wentao Wang, Chandler, AZ (US); Gregory Rosendahl, Gilbert, AZ (US); Amin Azimi, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 311 days.

(21) Appl. No.: 18/397,372

(22) Filed: Dec. 27, 2023

(65) Prior Publication Data

US 2024/0222187 A1 Jul. 4, 2024

Related U.S. Application Data

(60) Provisional application No. 63/477,772, filed on Dec. 29, 2022.

(51) Int. Cl.

| | |
|---|---|
| ***C23C 16/44*** | (2006.01) |
| ***C23C 16/458*** | (2006.01) |
| ***H10P 72/76*** | (2026.01) |

(52) U.S. Cl.

CPC ...... *H10P 72/7626* (2026.01); *C23C 16/4412* (2013.01); *C23C 16/4581* (2013.01); *H10P 72/7624* (2026.01)

(58) Field of Classification Search

CPC ............. H10P 72/7626; H10P 72/7624; H10P 72/7616; H10P 72/7612; H10P 72/72;

(Continued)

(56) References Cited

U.S. PATENT DOCUMENTS

| | | | | |
|---|---|---|---|---|
| 6,190,113 B1 * | 2/2001 | Bui | H10P 72/7612 | 414/217 |
| 7,169,234 B2 * | 1/2007 | Weeks | H10P 72/7608 | 156/345.55 |

(Continued)

*Primary Examiner* — Rudy Zervigon
(74) *Attorney, Agent, or Firm* — Banner & Witcoff, Ltd.

(57) ABSTRACT

A shaft member includes a cylindrical body formed from a ceramic material and having a drive segment, a frustoconical segment, and an end key segment. The drive segment extends about a rotation axis, the frustoconical segment is offset from the drive segment along the rotation axis, and the end key segment extends axially from the frustoconical segment and is axially separated from the drive segment by the frustoconical segment of the shaft member. The end key segment has a first circumferential facet and a second circumferential facet circumferentially opposite the first circumferential facet to fix the shaft member in rotation about the rotation axis relative to a support member seated when the end key segment is slidably received within an end key socket defined within the support member. Process kits, semiconductor processing systems, and methods of making semiconductor processing systems are also described.

20 Claims, 13 Drawing Sheets

(58) Field of Classification Search

CPC ............... H10P 72/722; H10P 72/0434; H10P 72/0432; H10P 72/0421; H10P 72/0606; H10P 72/0604; H10P 72/0402; H10P 72/0436; H10P 72/7611; H10P 72/7622; H10P 72/0602; H10P 72/7618; H10P 72/7608; H10P 14/2905; H10P 14/3411; H10P 72/0414; H10P 72/0441; H10P 72/3306; H10P 72/50; H10P 72/70; H10P 14/24; H10P 14/6349; H10P 72/0458; H10P 72/74; H10P 72/7614; H10P 72/78; H10P 74/20; H10P 14/20; H10P 14/3442; H10P 14/3602; H10P 14/60; H10P 36/20; H10P 50/242; H10P 72/00; H10P 72/0424; H10P 72/1912; H10P 72/3302; H10P 72/57; H10P 72/76; H10P 72/7602; C23C 16/4412; C23C 16/4581; C23C 16/4584; C23C 16/4586; C23C 16/4401; C23C 16/24; C23C 16/4583; C23C 16/46; C23C 16/405; C23C 16/4409; C23C 16/45561; C23C 16/458; C23C 16/4585; C23C 16/4405; C23C 14/34; C23C 14/50; C23C 16/44; C23C 16/4404; C23C 16/52; C23C 16/325; C23C 16/345; C23C 16/4408; C23C 16/45591; C23C 16/481; C23C 16/50; C23C 16/505; C23C 16/5096; C30B 25/12; C30B 25/14; C30B 25/16; H01J 37/3244; H01J 37/32449

USPC ......... 269/1; 279/1; 118/715, 728, 729, 730; 156/345.33, 345.34, 345.51, 345.54, 156/345.55

See application file for complete search history.

(56) References Cited

U.S. PATENT DOCUMENTS

| | | | | |
|---|---|---|---|---|
| 11,018,047 | B2 * | 5/2021 | Rokkam | H10P 72/7612 |
| D965,524 | S * | 10/2022 | Patil | D13/118 |
| 12,040,217 | B2 * | 7/2024 | Hill | H10P 72/7612 |
| 2003/0173031 | A1 | 9/2003 | Aggarwal | |
| 2005/0011458 | A1 | 1/2005 | Aggarwal | |
| 2005/0166849 | A1 * | 8/2005 | Weeks | H10P 72/7608 118/730 |
| 2007/0056150 | A1 * | 3/2007 | Weeks | H10P 72/7608 414/935 |
| 2010/0089314 | A1 | 4/2010 | Goodman | |
| 2010/0212595 | A1 * | 8/2010 | Campaneria, IV | H10P 72/7624 118/500 |
| 2013/0126515 | A1 | 5/2013 | Shero | |
| 2014/0290573 | A1 * | 10/2014 | Okabe | C30B 25/12 118/500 |
| 2015/0037019 | A1 * | 2/2015 | Collins | H05B 3/0047 392/416 |
| 2019/0051555 | A1 | 2/2019 | Hill | |
| 2019/0109037 | A1 | 4/2019 | Halpin | |
| 2019/0341290 | A1 * | 11/2019 | LaBrie | H10P 72/7608 |
| 2020/0365444 | A1 | 11/2020 | Hill | |
| 2022/0181193 | A1 | 6/2022 | Gao | |

* cited by examiner

SHAFT MEMBERS, PROCESS KITS AND SEMICONDUCTOR PROCESSING SYSTEMS HAVING SHAFT MEMBERS, AND METHODS OF MAKING SEMICONDUCTOR PROCESSING SYSTEMS

CROSS-REFERENCE TO RELATED APPLICATIONS

This application claims priority to and benefit of U.S. Provisional Patent Application No. 63/477,772, filed on Dec. 29, 2022, the contents of which are incorporated herein by reference in their entirety.

FIELD OF INVENTION

The present disclosure generally relates to depositing material layers onto substrates during the fabrication of semiconductor devices. More particularly, the present disclosure relates to structures employed to support substrates during the deposition of material layers onto the substrates, such as during the fabrication of semiconductor devices.

BACKGROUND OF THE DISCLOSURE

Semiconductor devices, such as integrated circuit and power electronic devices, are commonly fabricated by depositing material layers onto substrates. Material layer deposition is generally accomplished by supporting the substrate within a reaction chamber on a substrate support, heating the substrate to a desired material layer deposition temperature using heater elements arranged outside of the reaction chamber, and flowing a material layer precursor across the substrate. As the material layer precursor flows across the substrate a material layer deposits onto the substrate, typically at a material layer deposition rate corresponding to temperature of the substrate. Once the material layer reaches a desired material layer thickness, flow of the material layer precursor ceases, and the substrate removed from the reaction chamber.

In some semiconductor processing systems, the substrate may be rotated within the reaction chamber during material layer deposition, for example, to promote cross-substrate thickness uniformity in the material layer deposited onto the substrate. Rotation is typically accomplished by coupling the substrate support to rotation source located outside of the reaction chamber with a shaft. The shaft is generally fixed in rotation relative to the substrate support by an anti-rotation feature to rotate communicate rotation from the rotation source to the substrate support. The shaft may also be formed from a material transparent to the radiant energy communicated to the substrate support to limit temperature variation across the substrate due to the tendency of the shaft to shade the substrate from the external heating elements employed to heat the substrate during material layer deposition. While generally satisfactory for its intended purpose, materials transparent to radiant energy may be relatively brittle, adding cost and complexity to fabrication of the shaft commensurate with the shape of anti-rotation feature employed to fix the shaft relative to the substrate support.

Such systems and methods have generally been considered suitable for their intended purpose. However, there remains a need in the art for improved shaft members, process kits and semiconductor processing systems including shaft members, and methods of making semiconductor processing systems including such shaft members. The present disclosure provides a solution to this need.

SUMMARY OF THE DISCLOSURE

A shaft member is provided. The shaft member includes a cylindrical body formed from a ceramic material and having a drive segment, a frustoconical segment, and an end key segment. The drive segment extends about a rotation axis, the frustoconical segment is offset from the drive segment along the rotation axis, and the end key segment extends axially from the frustoconical segment and is axially separated from the drive segment by the frustoconical segment of the shaft member. The end key segment has a first circumferential facet and a second circumferential facet circumferentially opposite the first circumferential facet to fix the shaft member in rotation about the rotation axis relative to a support member seated when the end key segment is slidably received within an end key socket defined within the support member.

In addition to one or more of the features described above, or as an alternative, further examples may include a probe member slidably received within the probe aperture and extending axially from the end key segment of the shaft member and in a direction axially opposite the frustoconical segment of the shaft member.

In addition to one or more of the features described above, or as an alternative, further examples may include that the ceramic material forming the cylindrical body of the shaft member is quartz, fused silica, or sapphire.

In addition to one or more of the features described above, or as an alternative, further examples may include that the frustoconical segment of the shaft member defines a frustoconical facet extending circumferentially about the rotation axis. The frustoconical segment may taper axially between the drive segment and the end key segment of the shaft member.

In addition to one or more of the features described above, or as an alternative, further examples may include that the frustoconical segment of the shaft member defines a frustoconical segment taper angle that is between about 15 degrees and about 60 degrees relative to the rotation axis.

In addition to one or more of the features described above, or as an alternative, further examples may include that the end key segment of the shaft member has an end facet, a radially inner arcuate facet, and a radially outer arcuate facet. The end facet may be substantially orthogonal relative to the rotation axis. The radially inner arcuate facet may substantially parallel to the rotation axis. The radially outer arcuate facet may be radially separated from the radially inner arcuate facet by the end facet.

In addition to one or more of the features described above, or as an alternative, further examples may include that the radially outer arcuate facet is substantially parallel to the radially inner arcuate facet.

In addition to one or more of the features described above, or as an alternative, further examples may include that the radially outer arcuate facet of the end key segment is oblique relative to the radially inner facet of the end key segment.

In addition to one or more of the features described above, or as an alternative, further examples may include that the first circumferential facet of the end key segment is substantially parallel to the second circumferential facet of the end key segment.

In addition to one or more of the features described above, or as an alternative, further examples may include that the first circumferential facet and the second circumferential facet are arranged along a common diameter. The common diameter may intersect the rotation axis. The first and second circumferential facets may be parallel to the common diameter.

In addition to one or more of the features described above, or as an alternative, further examples may include that the first circumferential facet and the second circumferential facet are arranged along a first diameter and a second diameter. The first diameter and the second diameter may intersect the rotation axis. The second diameter may be circumferentially offset about the rotation axis from the first diameter.

In addition to one or more of the features described above, or as an alternative, further examples may include that the cylindrical body of the shaft member defines a probe aperture extending axially between the drive segment and the end key segment of the cylindrical body. The first circumferential facet and the second circumferential facet of the end key segment may be radially offset from the probe aperture.

A process kit is provided. The process kit includes a support member and a shaft member as described above. The support member includes a hub structure defining a shaft socket and an end key socket, a plurality of arm portions extending radially from the hub structure, and a plurality of finger structures connected to the hub structure by the plurality of the arm portions and extending axially from the plurality of finger structures. The support member is formed from the ceramic material forming the shaft member, the frustoconical segment of the shaft member is slidably received within the shaft socket of the support member to fix the support member axially along the rotation axis, and the end key segment of the shaft member is slidably received with the end key socket of the support member to fix the support member relative to the shaft member in rotation about the rotation axis.

In addition to one or more of the features described above, or as an alternative, further examples may include that the end key socket has a first circumferential face and a second circumferential face circumferentially spaced apart from one another about the rotation axis, that the first circumferential face of the end key socket circumferentially opposes the first circumferential facet of the shaft member, and that the second circumferential face of the end key socket circumferentially opposes the second circumferential facet of the shaft member.

In addition to one or more of the features described above, or as an alternative, further examples may include that the first circumferential facet has a facet radial width, that the first circumferential face has a face radial width, and that the face radial width is greater than the facet radial width.

In addition to one or more of the features described above, or as an alternative, further examples may include the hub structure has an annulus portion and a lug portion. The hub structure may extend circumferentially about the rotation axis. The lug portion may extend radially toward the rotation axis from the hub structure, may overlie and be spaced apart from the frustoconical segment of the shaft member, and may bound the end key aperture and abutting the end key segment of the shaft member.

In addition to one or more of the features described above, or as an alternative, further examples may include that the end key segment of the shaft member is radially separated from the hub structure within the end key socket.

In addition to one or more of the features described above, or as an alternative, further examples may include that an interior surface of the hub structure has an annular segment bounding the end key socket. The annular segment of the hub structure may oppose a radially outer facet of the end key segment of the hub structure.

A semiconductor processing system is provided. The semiconductor processing system includes a precursor delivery arrangement and a chamber arrangement. The precursor delivery arrangement include a silicon-containing material layer precursor. The chamber arrangement is connected to the precursor delivery arrangement and includes a process kit. The process kit includes a shaft member as described above, a support member seated on the shaft member, and a substrate support seated on the support member. The support member is formed from quartz, the ceramic material forming the shaft member is quartz, and the frustoconical segment of the shaft member defines a frustoconical segment taper angle between about 15 degrees and about 65 degrees relative to the rotation axis.

The frustoconical segment of the shaft member defines a frustoconical segment taper angle between about 15 degrees and about 65 degrees relative to the rotation axis, and the end key segment of the shaft member has a first circumferential facet and a second circumferential facet circumferentially spaced apart from one another about the rotation axis.

A method of making a semiconductor processing system is provided. The method includes, at a shaft member as described above, registering a support member having an end key socket to the end key segment of shaft member in rotation about the rotation axis, slidably seating the end key segment of the shaft member within the end key socket of the support member, and rotationally fixing the support member relative to the shaft member by abutting the first circumferential facet against a first circumferential face of the support member.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 16:
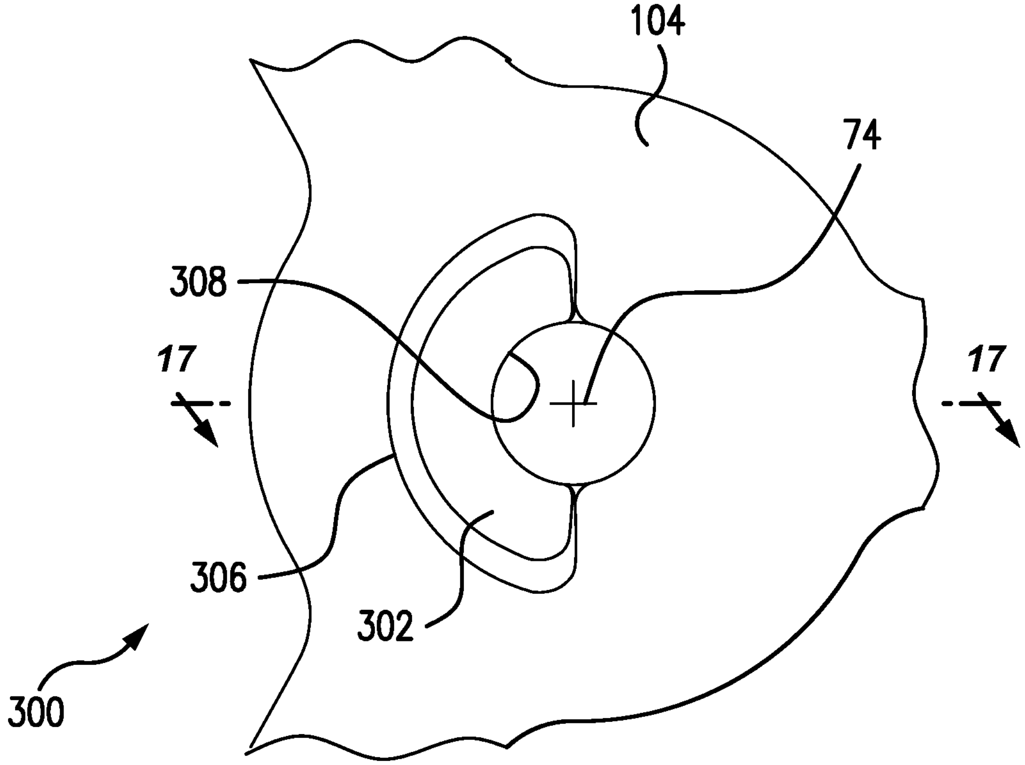
Figure 17:
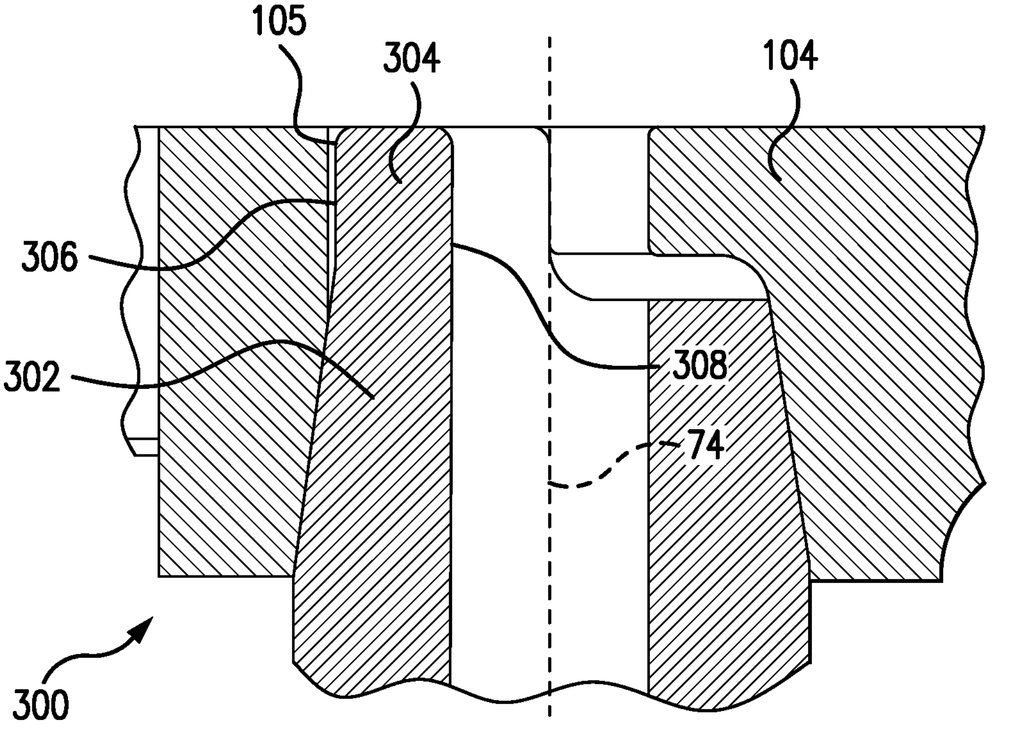
Figure 18:
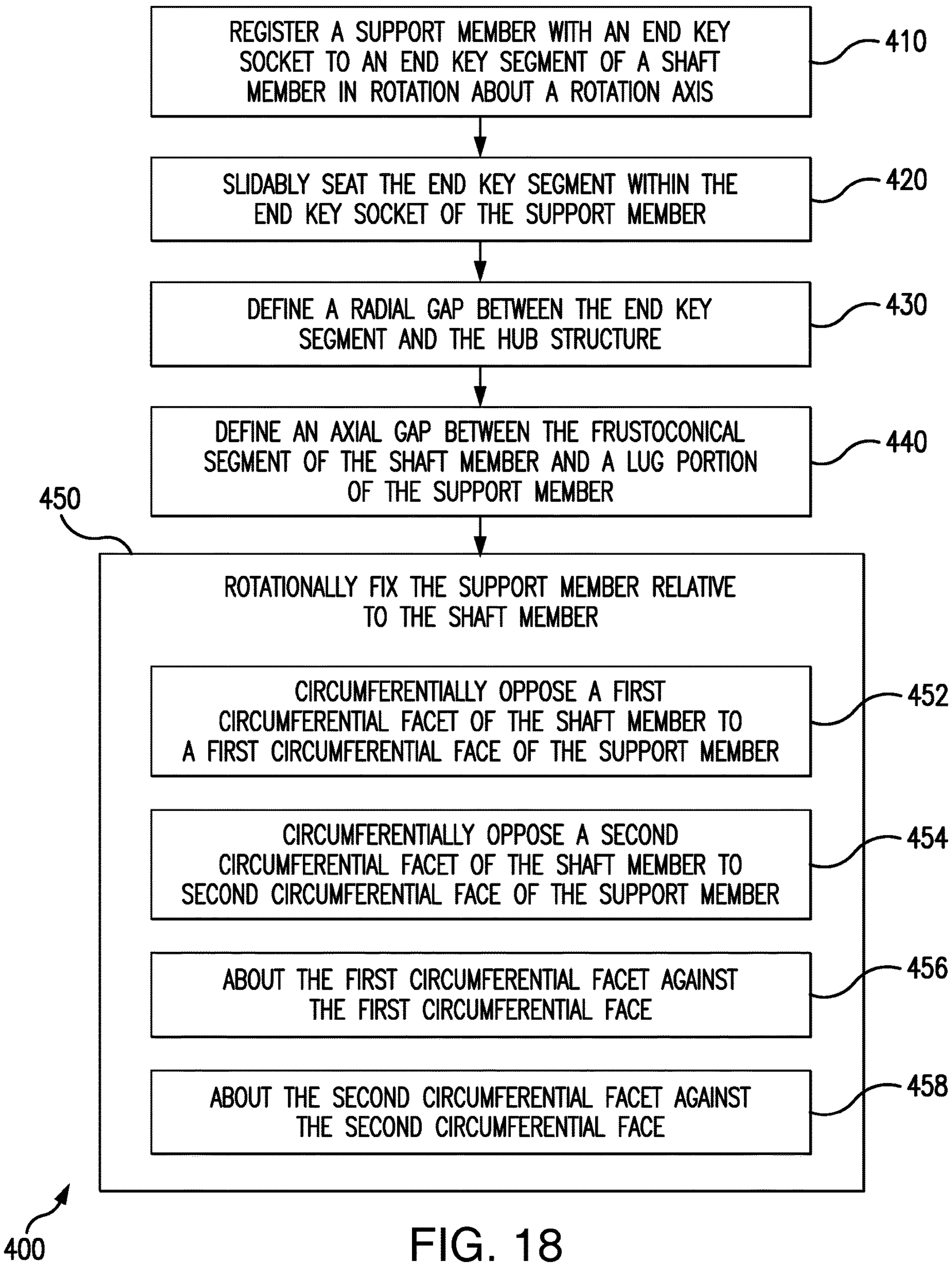

FIGS. 14-17 are plan and section views of other examples of shaft members in accordance with the present disclosure, showing engagement of end key segments with the hub structure of the support according to the examples; and FIG. 18 is block diagrams of a method of making a semiconductor processing systems according to an example of the present disclosure, showing operations of the method according to illustrative and non-limiting examples of methods of making semiconductor processing system according to the present disclosure.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
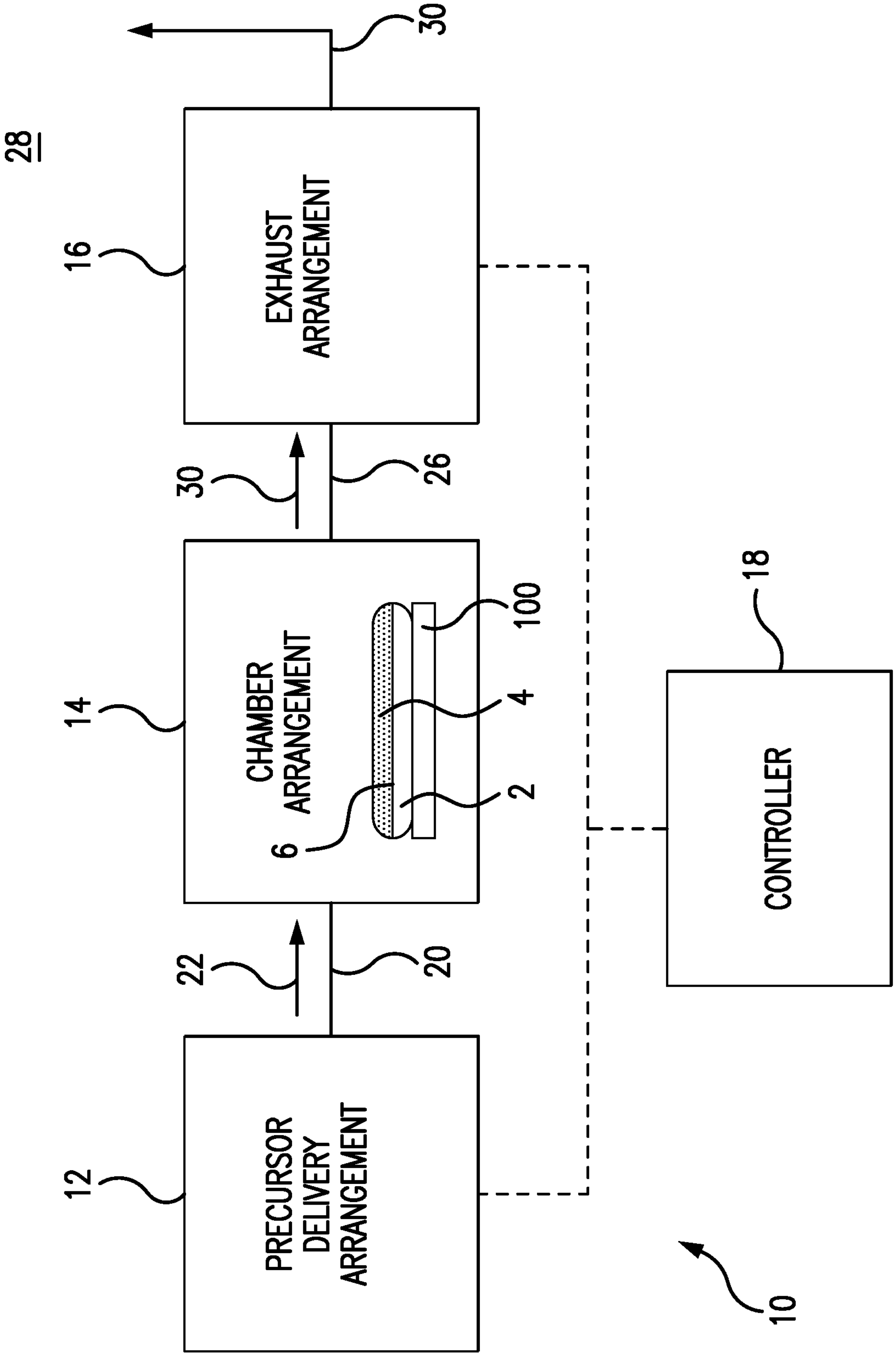
FIG. 1 is a schematic view of a semiconductor processing system in accordance with the present disclosure, showing a chamber arrangement including a process kit with a shaft member arranged within a chamber body to support a substrate during deposition of a material layer onto the substrate.

Reference will now be made to the drawings wherein like reference numerals identify similar structural features or aspects of the subject disclosure. For purposes of explanation and illustration, and not limitation, a partial view of an example of a process kit including a shaft member in accordance with the present disclosure is shown in FIG. 1 and is designated generally by reference character 100. Other examples of process kits, shaft members, semiconductor processing systems including process kits with shaft members, and methods of making semiconductor processing systems in accordance with the present disclosure, or aspects thereof, are provided in FIGS. 2-18, as will be described. The systems and methods of the present disclosure may be used to support substrates during the deposition of material layers onto the substrates, such as during deposition of epitaxial material layers onto substrate using chemical vapor deposition (CVD) techniques during the fabrication of semiconductor devices, though the present disclosure is not limited to epitaxial materials or CVD techniques in general.

Referring to FIG. 1, a semiconductor processing system 10 is shown. The semiconductor processing system 10 generally incudes a precursor delivery arrangement 12, a chamber arrangement 14, an exhaust arrangement 16, and a controller 18. The precursor delivery arrangement 12 is connected to the chamber arrangement 14 by the a precursor supply conduit 20 and is configured to provide a flow of a material layer precursor 22 to the chamber arrangement 14. The chamber arrangement 14 includes a chamber body 24 (shown in FIG. 2) and a process kit 100, is connected to the exhaust arrangement 16 by an exhaust conduit 26, and is configured to flow the material layer precursor 22 provided by the precursor delivery arrangement 12 across a substrate 2 supported on the process kit 100 during deposition of a material layer 4 onto an upper surface 6 of the substrate 2 using the material layer precursor 22.

The exhaust arrangement 16 is in fluid communication with an external environment 28 outside of the semiconductor processing system 10 and is configured to communicate a flow or residual precursor and/or reaction products 30 issued by the chamber arrangement 14 to the external environment 28. The controller 18 is operably connected to the precursor delivery arrangement 12 to provide the material layer precursor 22 to the chamber arrangement 14. The controller 18 is also operably connected to the exhaust arrangement 16 to control environmental conditions within the chamber arrangement 14 during deposition of the material layer 4 onto the substrate 2. It is further contemplated that that controller 18 be operably connected to the process kit 100, for example, to seat and unseat the substrate 2 as well as to rotate the substrate 2 during deposition of the material layer 4 onto the upper surface 6 of the substrate 2. In certain examples the exhaust arrangement 16 may include one or more of a vacuum pump and an abatement apparatus, such as a scrubber by way of non-limiting example.

Figure 2:
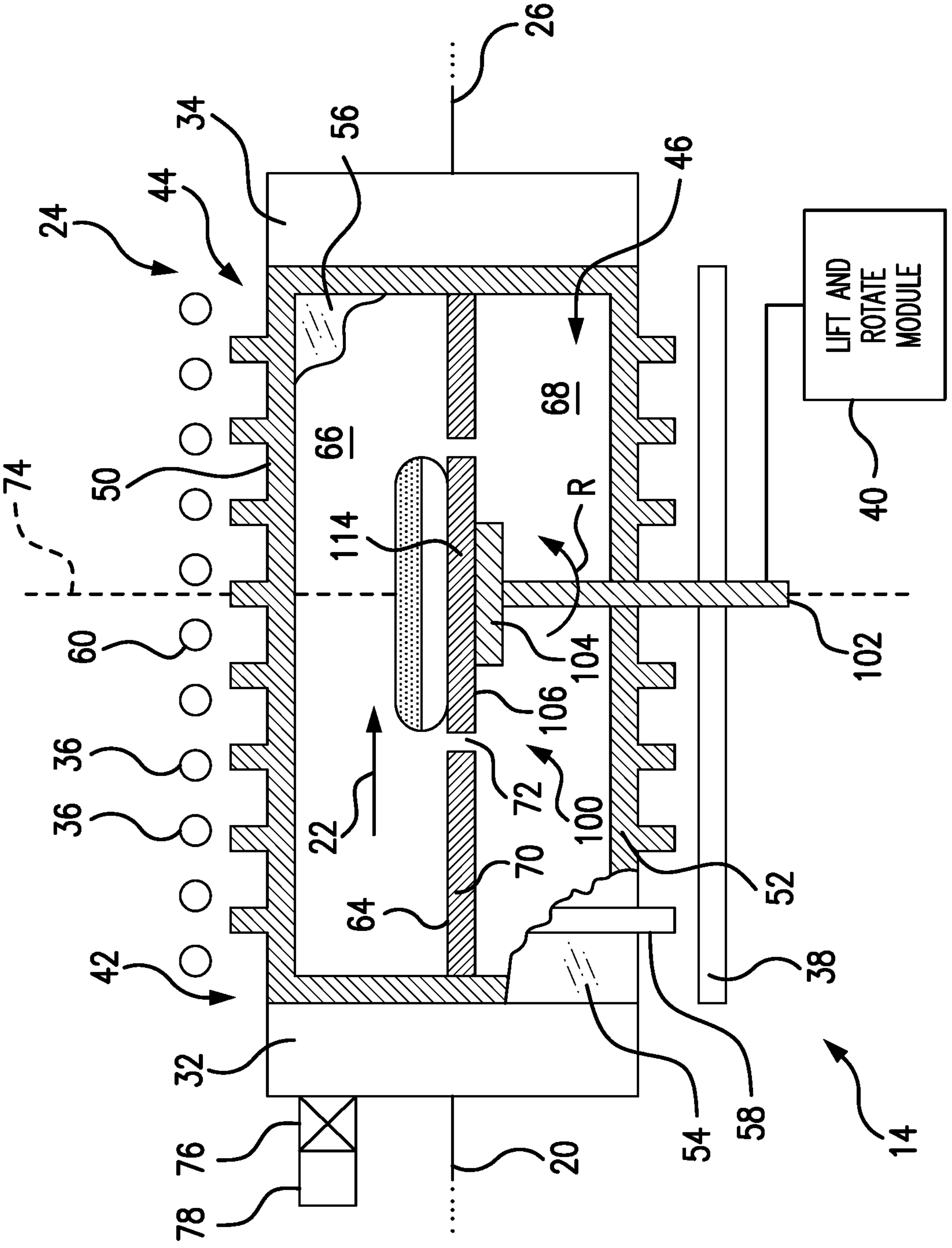
FIG. 2 is a schematic view of the chamber arrangement of FIG. 1 according to an example of the present disclosure, showing a substrate support seated on a support member and the shaft member to support the substrate during deposition of the material layer onto the substrate.

With reference to FIG. 2, the chamber arrangement 14 is shown. The chamber arrangement 14 includes the chamber body 24, an injection flange 32, and an exhaust flange 34. The chamber arrangement 14 also includes an upper heater element array 36, a lower heater element array 38, and a lift and rotate module 40. In the illustrated example the chamber arrangement 14 further includes a process kit 100 including the shaft member 102, a support member 104, and a substrate support 106. Although the process kit 100 is shown and described herein as including certain elements, it is to be understood and appreciated that the process kit 100 may include additional elements and/or omit elements shown and described herein and remain within the scope of the present disclosure.

The chamber body 24 has an injection end 42 and a longitudinally opposite exhaust end 44. The injection flange 32 abuts the injection end 42 of the chamber body 24, is connected to the precursor supply conduit 20, and fluidly couples the precursor delivery arrangement 12 (shown in FIG. 1) to an interior 46 of the chamber body 24. The exhaust flange 34 abuts the exhaust end 44 of the chamber body 24, is connected to the exhaust conduit 26, and fluidly couples the interior 46 of the chamber body 24 to the exhaust arrangement 16 (shown in FIG. 1) through the exhaust conduit 26. It is contemplated that the chamber body 24 be formed from a transparent material 48, for example, a material transmissive to electromagnetic radiation within an infrared waveband. Examples of suitable transparent materials include ceramic materials such as quartz, fused silica, and sapphire.

The chamber body 24 has an upper wall 50, a lower wall 52, a first sidewall 54, and a second sidewall 56. The upper wall 50 extends between the injection end 42 and the exhaust end 44 of the chamber body 24. The lower wall 52 extends in parallel with the upper wall 50 between the injection end 42 and the exhaust end 44 of the chamber body 24. The lower wall 52 is further separated from the upper wall 50 by the interior 46 of the chamber body 24 and is coupled to the upper wall 50 by the first sidewall 54 and the second sidewall 56. The first sidewall 54 and second sidewall 56 are laterally separated from one another by the interior 46 of the chamber body 24 and extend longitudinally between injection end 42 and the exhaust end 44 of the chamber body 24. In the illustrated example the chamber body 24 further includes a plurality of external ribs 58 extending about an exterior of the chamber body 24 and longitudinally spaced apart from one another between the injection end 42 and the exhaust end 44 of the chamber body 24. As will be appreciated by those of skill in the art in view of the present disclosure, the chamber body 24 may have no ribs and remain within the scope of the present disclosure. As will also be appreciated by those of skill in the art in view of the present disclosure, one or more of the walls may have one or more arcuate or dome-like wall and remain within the scope of the present disclosure.

The upper heater element array 36 is supported above the upper wall 50 of the chamber body 24 and includes a plurality of upper heater elements 60. The plurality of upper heater elements 60 each include a filament-type linear heat lamp configured to communicate infrared electromagnetic radiation into the interior 46 of the chamber body 24, extend laterally above the upper wall 50 of the chamber body 24, and are longitudinally spaced apart from the one another between the injection end 42 and the exhaust end 44 of the chamber body 24. The lower heater element array 38 is similar to the upper heater element array 36 and additionally includes a plurality of lower heater elements 62. The plurality of lower heater elements 62 are supported below the lower wall 52 of the chamber body 24, are laterally spaced apart from one another below the chamber body 24, and extend longitudinally between the injection end 42 and the exhaust end 44 of the chamber body 24. Although shown and described herein as including linear heat lamps it is to be understood and appreciated that either (or both) the upper heater element array 36 and the lower heater element array 38 may include bulb-type heater elements. It is also contemplated that either (or both) the upper heater element array 36 and/or the lower heater element array 38 may include (or cooperate with) spot lamps and remain within the scope of the present disclosure.

It is contemplated that a divider 64 be fixed within the interior 46 of the chamber body 24. The divider 64 divides the interior 46 of the chamber body 24 into an upper chamber 66 and a lower chamber 68 and defines a divider aperture 72. The divider aperture 72 extends through a thickness of the divider 64, couples an upper surface to an lower surface of the divider 64, and fluidly couples the upper chamber 66 of the chamber body 24 to the lower chamber 68 of the chamber body 24. In certain examples, the divider 64 may be further formed from an opaque material 70, for example, a material opaque to electromagnetic radiation within an infrared waveband. Examples of suitable opaque materials include carbonaceous materials such as graphite and silicon carbide. In this respect the divider 64 may be monolithically formed from a silicon carbide material.

The process kit 100 includes the shaft member 102, a support member 104, and a substrate support 106. The substrate support 106 is arranged within the interior 46 of the chamber body 24 and at least partially within the divider aperture 72, is supported for rotation R about a rotation axis 74 extending through the divider aperture 72, and is configured to support the substrate 2 during deposition of the material layer 4 onto the upper surface 6 of the substrate support 106. The support member 104 is arranged along the rotation axis 74 and within the lower chamber 68 of the chamber body 24, is fixed in rotation relative to the substrate support 106, and couples the substrate support 106 to the shaft member 102. The shaft member 102 is arranged along the rotation axis 74 and is fixed in rotation relative to the support member 104, extends through the lower wall 52 of the chamber body 24, and couples the substrate support 106 to the lift and rotate module 40 through the support member 104.

The lift and rotate module 40 is configured to rotate the substrate support 106 about the rotation axis 74 using the shaft member 102 and the support member 104. The lift and rotate module 40 is further configured to seat and unseat the substrate 2 from the substrate support 106 for loading the substrate 2 into chamber body 24 prior to deposition of the material layer 4 onto the substrate 2 and unloading of the substrate 2 from the chamber body 24 subsequent to deposition of the material layer 4 onto the substrate 2. Loading and unloading may be accomplished in cooperation with a gate valve 76 and a substrate transfer robot 78. Loading and unloading may also be accomplished in cooperation with one or more lift pins and a lift pin actuator. Examples of suitable lift pins and lift pin actuators suitable for inclusion in the chamber arrangement 14 and the semiconductor processing system 10 include those shown and described in U.S. Pat. No. 10,770,336, issued of Sep. 8, 2020, the contents of which are incorporated herein by reference in their entirety.

Figure 3:
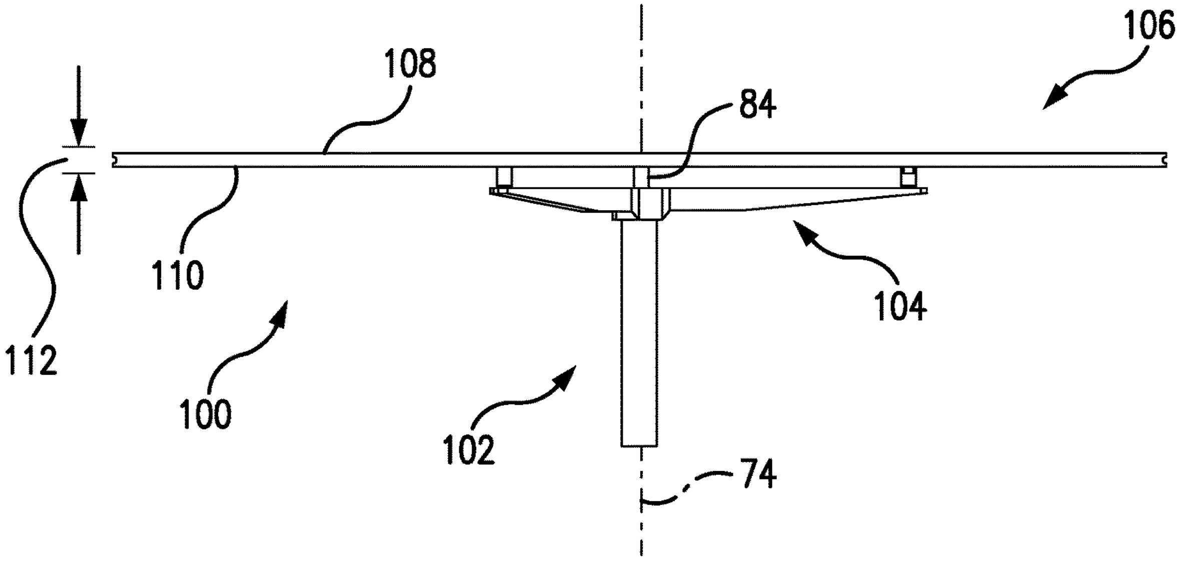
FIG. 3 is a side elevation view of the process kit of FIG. 1 according to an example of the present disclosure, showing the substrate support and the support member fixed in rotation relative to the shaft member.
Figure 4:
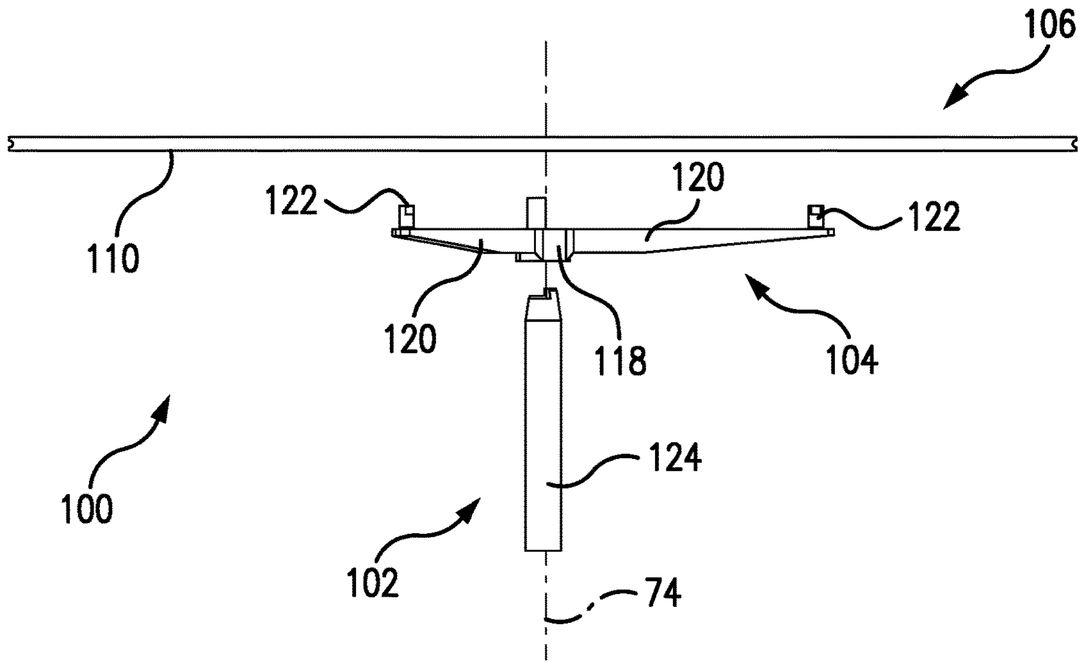
FIG. 4 is an exploded view of the process kit of FIG. 1 according to an example of the present disclosure, showing the substrate support and the support member of the process kit exploded away from the shaft member of the process kit.

With reference to FIGS. 3 and 4, the process kit 100 is shown. As shown in FIG. 3, the process kit 100 includes the shaft member 102, the support member 104, and the substrate support 106. The substrate support 106 is arranged along the rotation axis 74 and has an upper surface 108, an axially opposite lower surface 110, and a thickness 112 separating the lower surface 110 of the substrate support 106 from the upper surface 108 of the substrate support 106. It is contemplated that the substrate support 106 be formed from an opaque material 114 (shown in FIG. 2), for example, a material opaque to electromagnetic radiation within an infrared waveband. Examples of suitable opaque materials include carbonaceous materials such as graphite, pyrolytic carbon, and silicon carbide by way of non-limiting example.

As shown in FIG. 4, the support member 104 has a hub structure 118, a plurality of arm structures 120, and a plurality of finger structures 122. The plurality of finger structures 122 are each radially offset from the rotation axis 74 and extend axially along the rotation axis 74 from the plurality of arm structures 120. The plurality of finger structures 122 are further configured to fix the support member 104 in rotation relative to the substrate support 106 about the rotation, for example, by tips of the plurality of finger structures 122 being slidably received within radial slots defined within the lower surface 110 of the substrate support 106. The plurality of arm structures 120 each extend radially between the hub structure 118 and the plurality of finger structures 122 and couple the plurality of finger structures 122 to the hub structure 118. The shaft member 102 is arranged along the rotation axis 74, includes a cylindrical body 124, and is configured to seat thereon the support member 104 and therethrough the substrate support 106. In certain examples the support member 104 may include three (3) arm structures and three (3) finger structures. As will be appreciated by those of skill in the art in view of the present disclosure, the support member 104 may include fewer or addition arm structures and/or finger structures and remain within the scope of the present disclosure.

Figure 5:
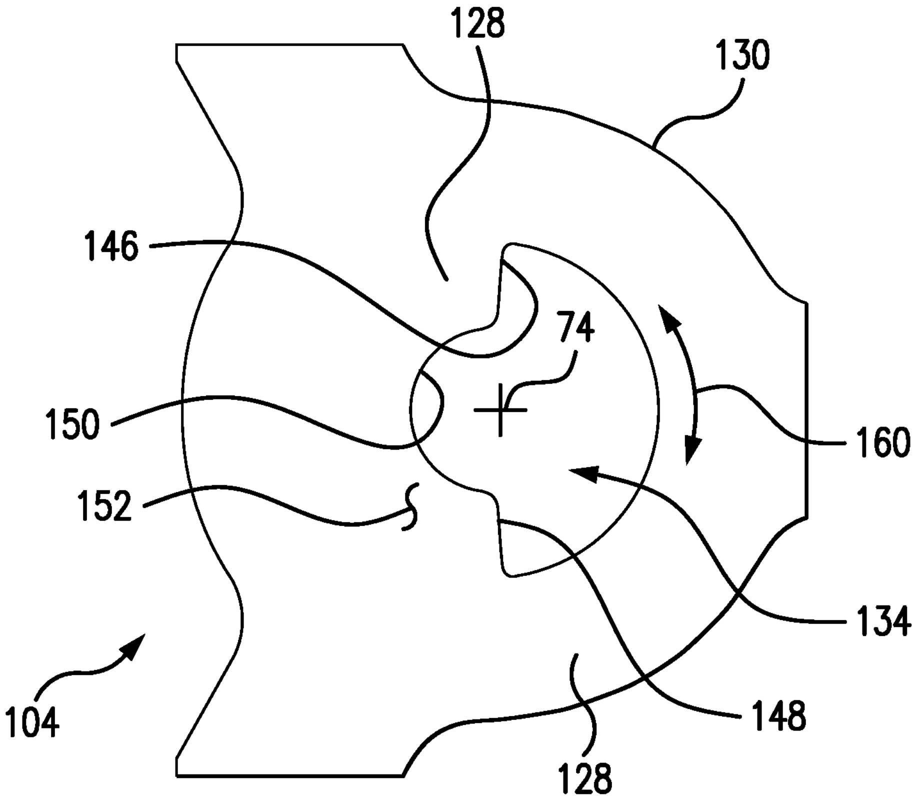
FIGS. 5 and 6 are plan and section views of the support member and shaft member of the process kit of FIG. 1 according to an example of the present disclosure, showing a hub structure defining an end key socket and a shaft socket within the interior of the hub structure.
Figure 6:
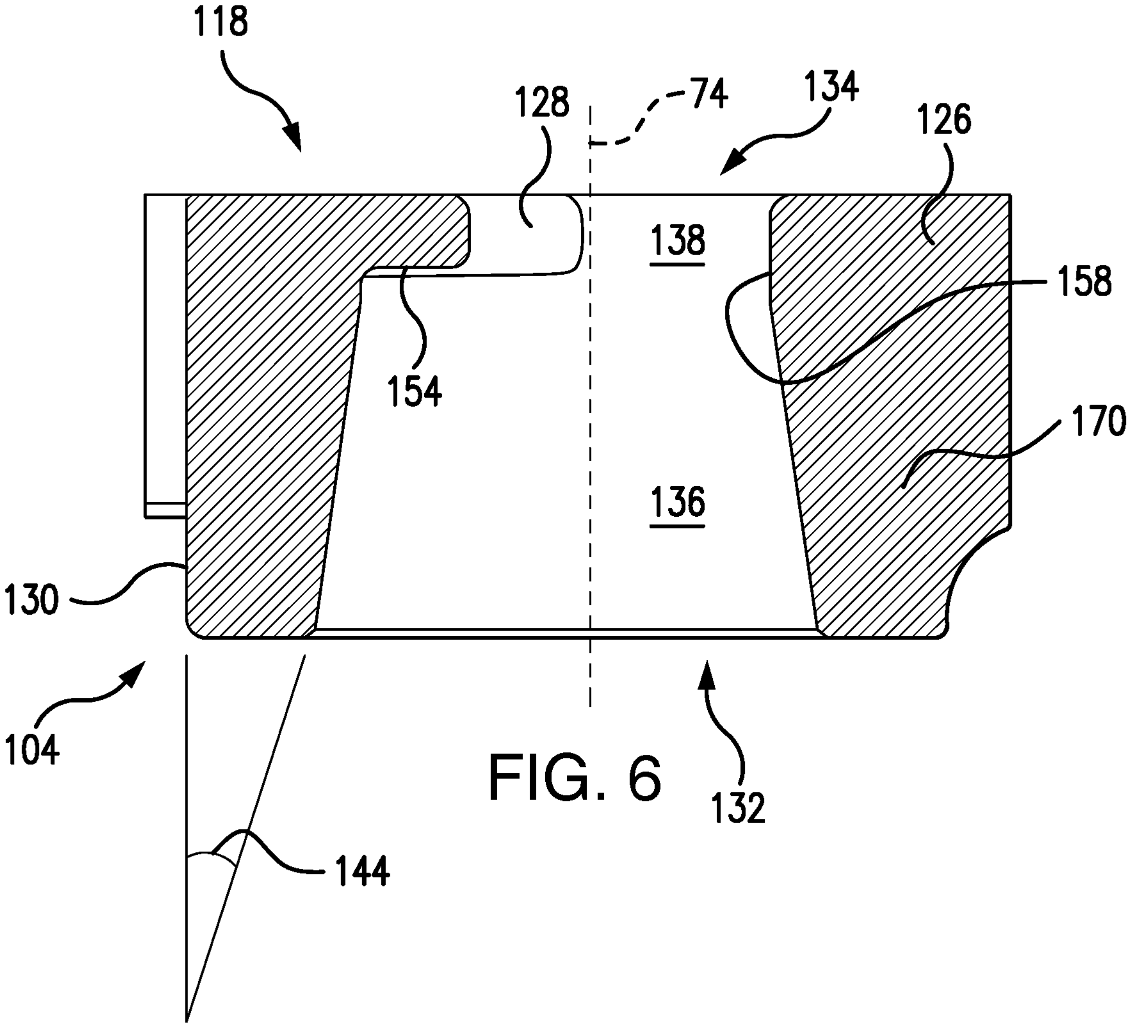

With reference to FIGS. 5 and 6, the support member 104 is shown. As shown in FIG. 5, the hub structure 118 extends about the rotation axis 74 and includes an annular portion 126 and a lug portion 128. The annular portion 126 and the lug portion 128 define an exterior surface 130 of the hub structure 118. The annular portion 126 and the lug portion 128 further bound a shaft aperture 132 and an end key aperture 134 defined within the exterior surface 130 of the hub structure 118. The end key aperture 134 opposes the lower surface 110 (shown in FIG. 3) of the substrate support 106 (shown in FIG. 2) and the shaft aperture 132 opposes the lower wall 52 (shown in FIG. 2) of the chamber body 24 (shown in FIG. 2). The shaft aperture 132 further couples a shaft socket 136 defined within the hub structure 118 to the external environment 28 (shown in FIG. 1) outside the support member 104, the end key aperture 134 further couples an end key socket 138 also defined within the hub structure 118 to the external environment 28 outside of the support member 104, and the end key socket 138 couples the shaft socket 136 to the external environment 28 outside of the support member 104 through the end key aperture 134.

As shown in FIG. 6, the shaft socket 136 is configured to seat therein a frustoconical segment 142 (shown in FIG. 7) of the shaft member 102 (shown in FIG. 2) and in this respect is bounded by the shaft aperture 132, the end key socket 138, an interior surface 140 of the annular portion 126 of the hub structure 118, and the lug portion 128 of the hub structure 118. The shaft socket 136 further intersects the rotation axis 74, is generally frustoconical in shape, and tapers in radial width between the shaft aperture 132 and the end key socket 138 at a shaft socket angle 144 relative to the rotation axis 74. In certain examples, the shaft socket angle 144 may be an oblique angle. In accordance with certain examples, the shaft socket angle 144 may be between about 10 degrees and about 70 degrees. For example the shaft socket angle 144 may be between about 10 degrees about 25 degrees, or between about 25 degrees and about 40 degrees, or between about 40 degrees and about 55 degrees, or even between about 55 degrees and about 70 degrees. Advantageously, shaft socket angles within these ranges can simplify fabrication of the support member 104 and the shaft member 102, for example, by enabling the frustoconical segment 142 of the shaft member 102 to be formed using a turning operation. In certain examples the support member 104 may be formed from a transparent material 170, for example, a material transmissive to electromagnetic radiation within an infrared waveband. Examples of suitable transparent materials include ceramic materials such as quartz, fused silica, and sapphire.

With continuing reference to FIG. 5, the lug portion 128 of the hub structure 118 is configured to fix the shaft member 102 (shown in FIG. 2) in rotation relative to the support member 104 and in this respect extends radially inward from the annular portion 126 of the hub structure 118, axially overlays the shaft socket 136, and radially bounds the end key aperture 134. It is contemplated that lug portion 128 have a first circumferential face 146, a second circumferential face 148, an arcuate lug face 150, an exterior lug face 152, and an interior lug face 154 (shown in FIG. 6). The first circumferential face 146 and the second circumferential face 148 are radially offset from the rotation axis 74, circumferentially oppose one another, and are coupled to one another by the arcuate lug face 150. The exterior lug face 152 and the interior lug face 154 are axially spaced apart from one another by the first circumferential face 146, the second circumferential face 148, and the arcuate lug face 150. The exterior lug face 152 of the lug portion 128 further defines a portion of the exterior surface 130 of the support member 104, opposes the lower surface 110 of the substrate support 106, and is axially spaced apart from the lower surface 110 of the substrate support 106. The interior lug face 154 of the lug portion 128 bounds the shaft socket 136, is radially offset from the rotation axis 74, and traces an arcuate path extending only partially about the rotation axis 74.

The end key socket 138 is configured to receive therein an end key segment 156 (shown in FIG. 7) of the shaft member 102 (shown in FIG. 2) and in this respect is defined axially within the hub structure 118 between the end key aperture 134 and the shaft socket 136, is coupled to the shaft aperture 132 by the shaft socket 136, and intersects the rotation axis 74. The end key socket 138 is further bounded by the first circumferential face 146 (shown in FIG. 5) and the second circumferential face 148 (shown in FIG. 5) of the lug portion 128 of the hub structure 118, the arcuate lug face 150 (shown in FIG. 5) of the lug portion 128 of the hub structure 118, and an annular segment 158 of the interior surface 140 of the hub structure 118. The annular segment 158 of the hub structure 118 is substantially parallel to the rotation axis 74, extends axially between the shaft socket 136 and the end key aperture 134, and traces an arcuate span 160 radially offset from the rotation axis 74 extending between the first circumferential face 146 and the second circumferential face 148 of lug portion 128 of the hub structure 118. In certain examples, the arcuate span 160 (shown in FIG. 5) of the annular segment 158 may be between about 160 degrees and about 200 degrees. In this respect the arcuate span 160 may be between about 160 degrees and about 170 degrees, or between about 170 degrees and about 180 degrees, or between about 180 degrees and about 190 degrees, or even between about 190 degrees and about 200 degrees.

Figure 7:
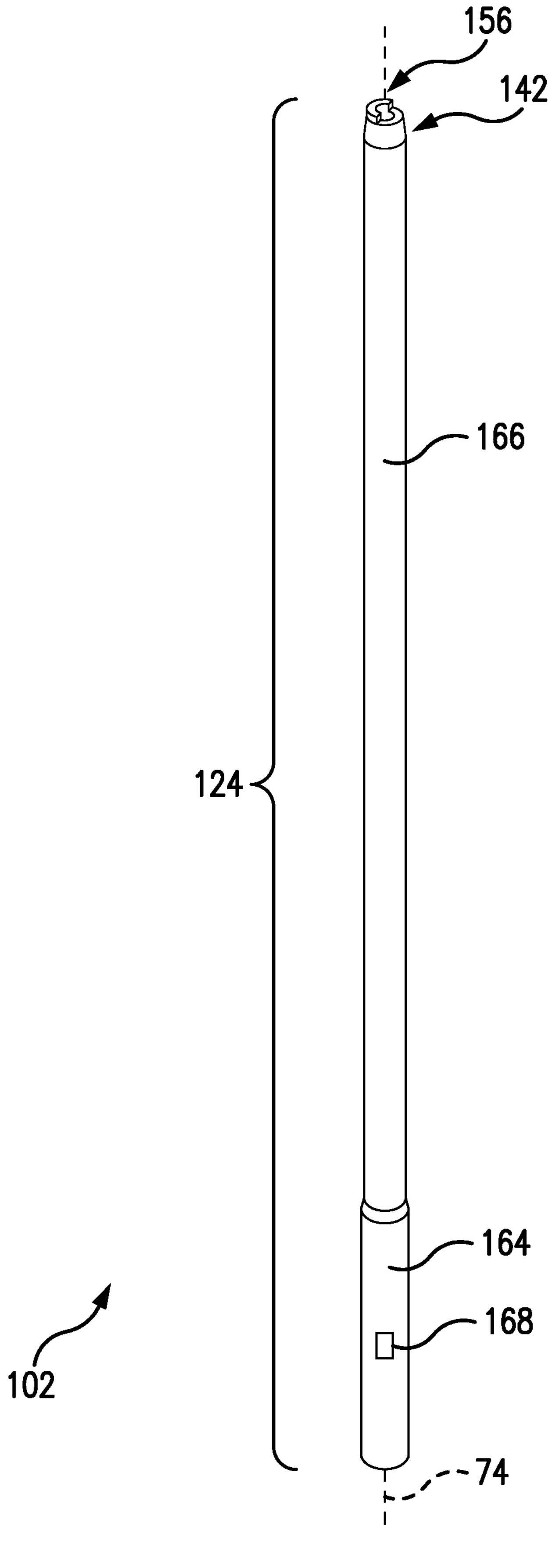
FIG. 7 is a perspective view of the shaft member included in process kit of FIG. 1, showing a cylindrical body formed from a ceramic material with a frustoconical segment connecting an end key segment to a drive segment of the shaft member.
Figure 8:
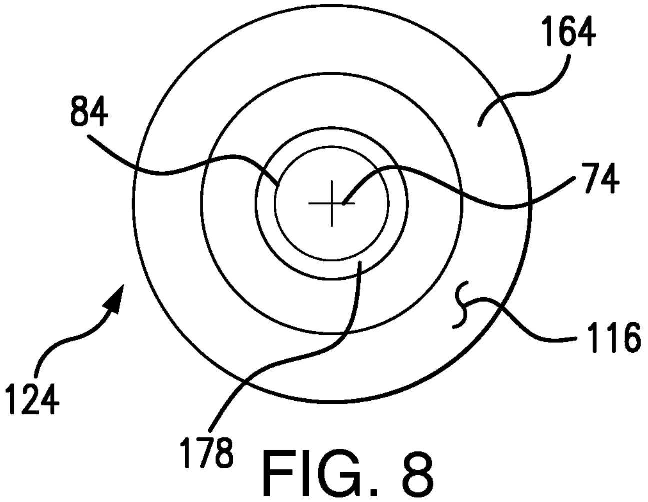
FIGS. 8 and 9 are bottom and perspective views of the shaft member according to an example of the present disclosure, showing a probe aperture extending through the cylindrical body of the shaft member and radially overlapped by the end key segment of the shaft member at a location radially offset from the frustoconical segment of the shaft member, respectively.

With reference to FIGS. 7-11, the shaft member 102 is shown. As shown in FIG. 7, the shaft member 102 generally includes a cylindrical body 124 having a drive segment 164, the frustoconical segment 142, and the end key segment. The drive segment 164 includes an engagement feature 168. The engagement feature 168 is configured to couple a drive element to the shaft member 102, for example, a gear element in mechanical communication with the lift and rotate module 40 (shown in FIG. 1). In certain examples, the engagement feature 168 may include a slot or spline defined within an external surface the drive segment 164 of the cylindrical body 124. In accordance with certain examples, the engagement feature 168 may include an aperture or a through-hole defined within the external surface of the drive segment 164 to receive therein (or therethrough) a fastener to fix the drive element to the shaft member 102. It is contemplated that the shaft member 102 (e.g., the cylindrical body 124) be formed from a ceramic material, such as a transparent material that is transmissive to electromagnetic radiation within an infrared waveband. Examples of suitable transparent materials include ceramic materials such as quartz, fused silica, and sapphire.

The stem segment 166 extends axially from the drive segment along the rotation axis 74 and connects the frustoconical segment 142 of the shaft member 102 to the drive segment 164 of the shaft member 102. The stem segment 166 is further configured to be received within a passthrough defined within the lower wall 52 (shown in FIG. 1) of the chamber body 24 (shown in FIG. 2), the shaft member 102 thereby coupling the lift and rotate module 40 (shown in FIG. 1) to the substrate support 106 (shown in FIG. 1) through the support member 104 (shown in FIG. 2). In certain examples, the stem segment 166 may define an annular cross-sectional area, the drive segment 164 may define an annular cross-sectional area, and the cross-sectional area of the drive segment 164 may have a greater diameter than the cross-sectional area of the drive segment 164, for example, to limit stress associated with the engagement feature 168.

Figure 9:
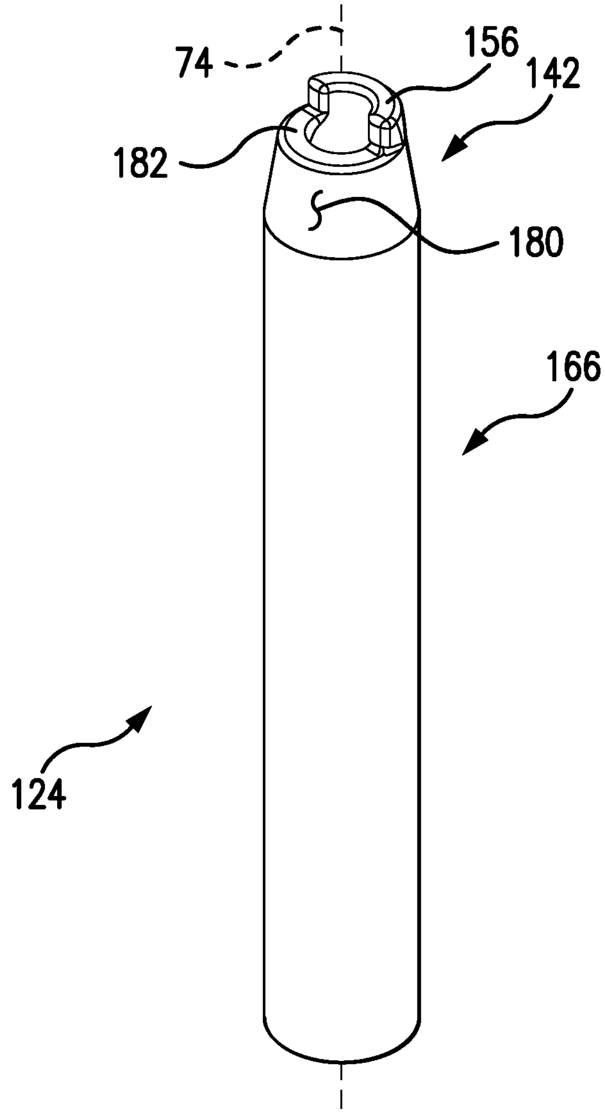
Figure 11:
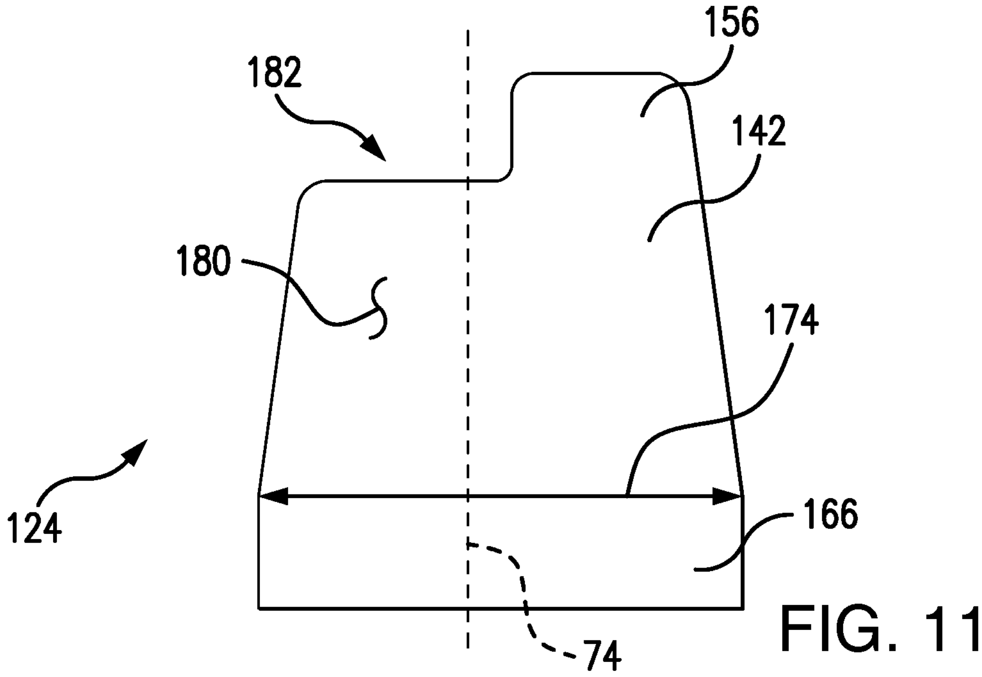

As shown in FIGS. 9 and 11, the frustoconical segment 142 of the shaft member 102 is axially offset from the stem segment 166 along the rotation axis 74 and is generally frustoconical in shape. The frustoconical segment 142 further tapers in radial width along the rotation axis 74 between a relatively large frustoconical radial width axially proximate the stem segment 166, and a relatively narrow frustoconical radial with axially proximate the end key segment 156. In this respect it is contemplated that the frustoconical segment 142 have a socket facet 180, extending about the rotation axis 74 and axially along an exterior of the cylindrical body 124, and a lug facet 182 axially terminating the frustoconical segment 142 along the rotation axis 74. It is contemplated that the socket facet 180 taper axially at an frustoconical segment taper angle 176 (shown in FIG. 13) between the stem segment 166 and the lug facet 182. It is further contemplated that lug facet 182 may be substantially orthogonal relative to the rotation axis 74, may axially terminate at a base of the end key segment 156, and may extend only partially about a probe aperture 178 defined within an interior of the probe aperture.

As shown in FIG. 11, the frustoconical segment 142 may define a seating diameter 174 extending circumferentially about the rotation axis 74 at a location axially between the stem segment 166 and the lug facet 182. In certain examples, the seating diameter 174 may axially separate the stem segment 166 from the frustoconical segment 142 of the shaft member 102. In accordance with certain examples, the seating diameter 174 may be substantially equivalent to a diameter of the shaft aperture 132 (shown in FIG. 6). It is contemplated that the frustoconical segment 142 may taper at an angle substantially equivalent to the taper of the shaft socket 136. In this respect it is contemplated that the frustoconical segment taper angle 176 may be substantially equivalent to the shaft socket angle 144 (shown in FIG. 6). As will be appreciated by those of skill in the art in view of the present disclosure, defining the seating diameter 174 to be substantially equivalent to the diameter of the shaft aperture 132 and the frustoconical segment taper angle 176 to be equivalent to the shaft socket angle 144 may simplify assembly of the support member 104 on the shaft member 102. In certain examples, the shaft socket angle 144 and the frustoconical segment taper angle 176 may be between about 15 degrees and about 65 degrees relative to the rotation axis 74. For example, the frustoconical segment taper angle 176 may be between about 15 degrees about 25 degrees, or between about 25 degrees and about 35 degrees, or between about 35 degrees and about 45 degrees, or between about 45 degrees and about 55 degrees, or even between about 55 degrees and about 65 degrees. Advantageously, angles within these ranges limit an axial force components between the shaft member 102 and the support member 104, facilitating removal of the support member 104 from the shaft member 102 during maintenance events, such as during replacement of the process kit 100 (shown in FIG. 1).

Figure 10:
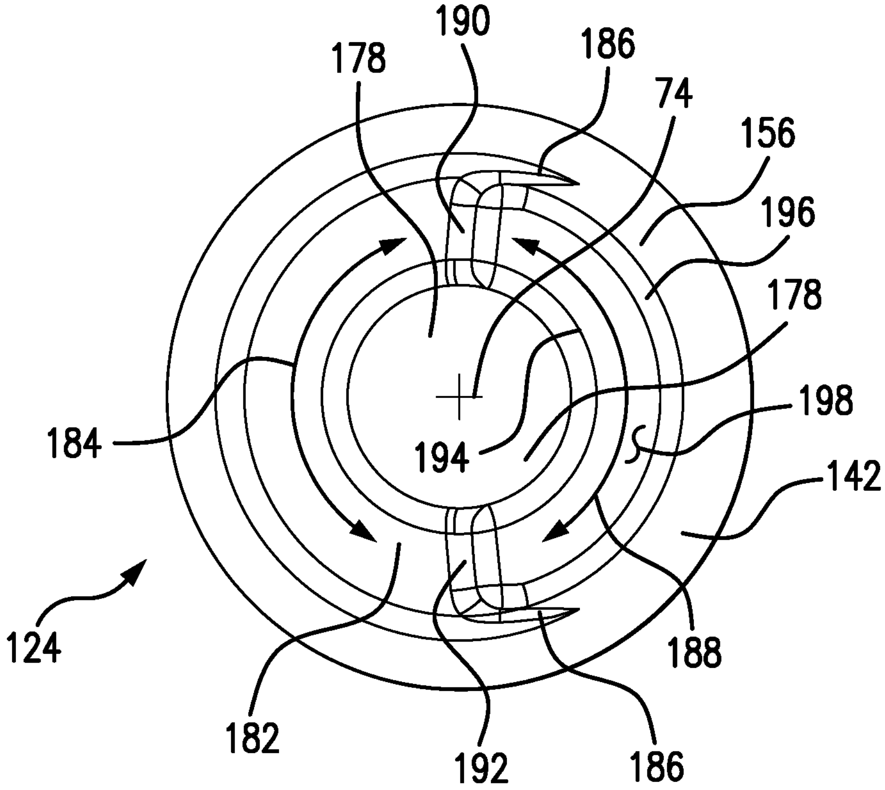
FIGS. 10 and 11 are top plan and side elevation views of the end key and frustoconical segments of the shaft member included in the process kit of FIG. 1 according to an example of the present disclosure, showing tapering of the frustoconical and end key segment in a direction opposite the drive segment of the shaft member, respectively.

As shown in FIG. 10, the probe aperture 178 is configured to receive therein the probe member 84. In this respect the probe aperture 178 extends axially through the cylindrical body 124 between an annular drive segment facet 116 and the end key segment 156 (shown in FIG. 7). It is contemplated that the probe aperture 178 may extend continuously and without interruption through interiors of the drive segment 164, the stem segment 166 (shown in FIG. 7), and the frustoconical segment 142 (shown in FIG. 7), the cylindrical body 124 being substantially annular along an axial length of the cylindrical body 124 forming the drive segment 164, the stem segment 166, and the frustoconical segment 142. In further respect, it is contemplated that the probe aperture 178 also be radially bounded by the end key segment 156 along an axial length of the end key segment 156, the cylindrical body 124 be half-annular (or less than half-annular) along the axial length of the end key segment 156. As shown in FIG. 3), the probe member 84 may extend axially from the end key segment 156 (shown in FIG. 7) in a direction axially opposite frustoconical segment 142, the probe member 84 thereby axially protruding from the cylindrical body 124. In this respect the probe member 84 may protrude from the cylindrical body 124 and abut the lower surface 110 of the substrate support 106, the probe member 84 thereby in intimate mechanical contact with the substrate support 106, the probe member 84 thereby configured to acquire tactile temperature measurements of the substrate support 106 for inferential temperature monitoring of the substrate 2 (shown in FIG. 1).

As shown in FIG. 11, the socket facet 180 may extend circumferentially about the rotation axis 74. The socket facet 180 may further extend axially to the lug facet 182 and be oblique relative to the rotation axis 74. The lug facet 182 may be substantially orthogonal relative to the rotation axis 74, have an arcuate span 184 extending only partially about the rotation axis 74, and connect the socket facet 180 to the end key segment 156. In certain examples the arcuate span 184 of the lug facet 182 may be less than 180 degrees. In accordance with certain examples, the arcuate span 184 may be greater than 180 degrees. It is also contemplated that the arcuate span 184 of the lug facet 182 may circumferentially overlap radially outward of the end key segment 156. In this respect the lug facet 182 may terminate at stress risers 186 separated from one another by the rotation axis 74 and spaced apart from the one another by the probe aperture 178 at locations radially outward of the end key segment 156.

The end key segment 156 extends axially from the frustoconical segment 142 of the cylindrical body 124 and traces an arcuate span 188 extending only partially about the rotation axis 74. The end key segment 156 further has a first circumferential facet 190, a second circumferential facet 192, and a radially inner arcuate facet 194, a radially outer arcuate facet 196, and an end facet 198. The first circumferential facet 190 and the second circumferential facet 192 are substantially parallel to the rotation axis 74, extend axially from the opposite end of the socket facet 180 of the frustoconical segment 142, and are radially offset from the rotation axis 74. The first circumferential facet 190 and the second circumferential facet 192 further terminate the arcuate span 184 and the arcuate span 188, the arcuate span 188 of the end key segment 156 having a smaller arcuate span than the arcuate span 184 of the lug facet 182. It is also contemplated that the first circumferential facet 190 and the second circumferential facet 192 fillet couple the radially inner arcuate facet 194 and the radially outer arcuate facet 196 to one another, that the end facet 198 further couple the first circumferential facet 190 to the second circumferential facet 192 at circumferential chamfers, and that the end facet 198 couple the radially inner arcuate facet 194 to the radially outer arcuate facet 196 at radially inner and radially outer chamfers.

It is contemplated that the first circumferential facet 190 have a first facet radial width (e.g., a planar extent of the first circumferential facet 190) and that the second circumferential facet 192 have a second facet radial width (e.g., a planar extent of the second circumferential facet 192). In certain examples, the second facet radial width may be substantially equivalent to the first facet radial width. In accordance with certain examples, the first facet radial width and the second radial width may terminate at a radially outer arcuate surface, from example, an axially extending chamfer. It is also contemplated that the first face radial width may be greater than a first facet radial width defined by the first circumferential facet 190 of the shaft member 102. Advantageously, forming the first circumferential face 146 with a first face radial width greater than the first facet radial width of the first circumferential facet 190 limits flat-on-flat contact area, reducing the likelihood of damage to either surface during operation. As will be appreciated by those of skill in the art in view of the present disclosure, the second circumferential facet 192 and the second circumferential face 148 may be similar in this respect.

Figure 12:
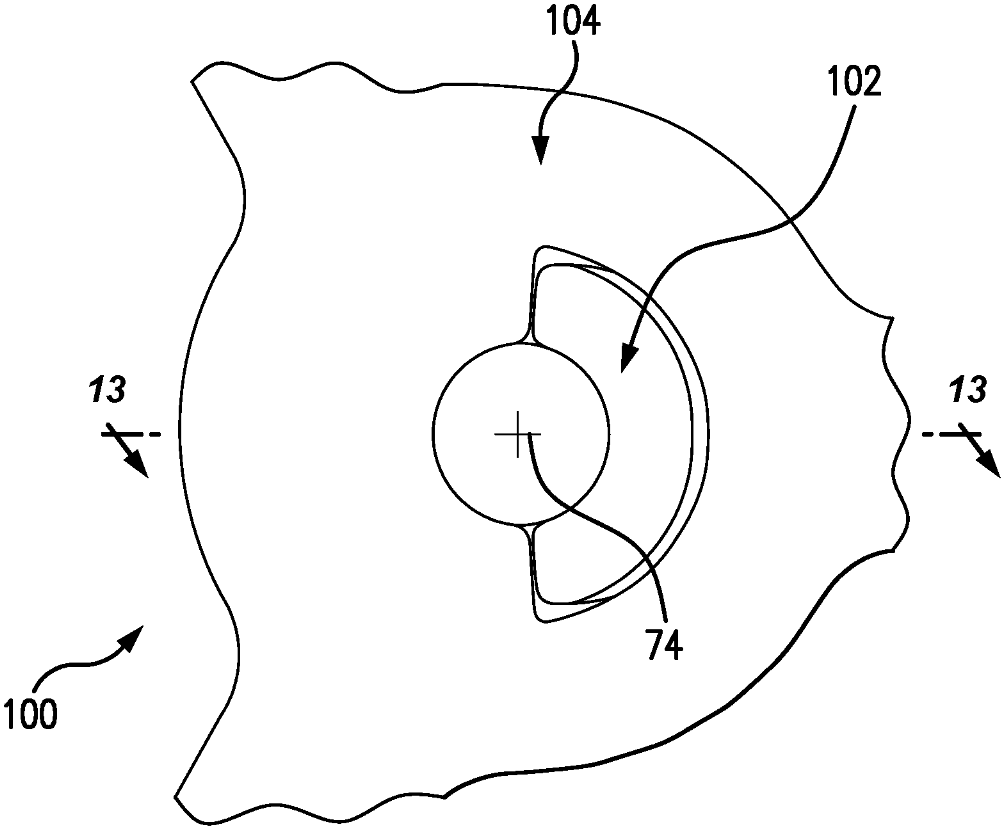
FIGS. 12 and 13 are top plan and section views of a portion of the process kit of FIG. 1 according to an example of the present disclosure, showing the end key segment and the frustoconical segment of the shaft member seated within the hub structure of the support member, respectively.
Figure 13:
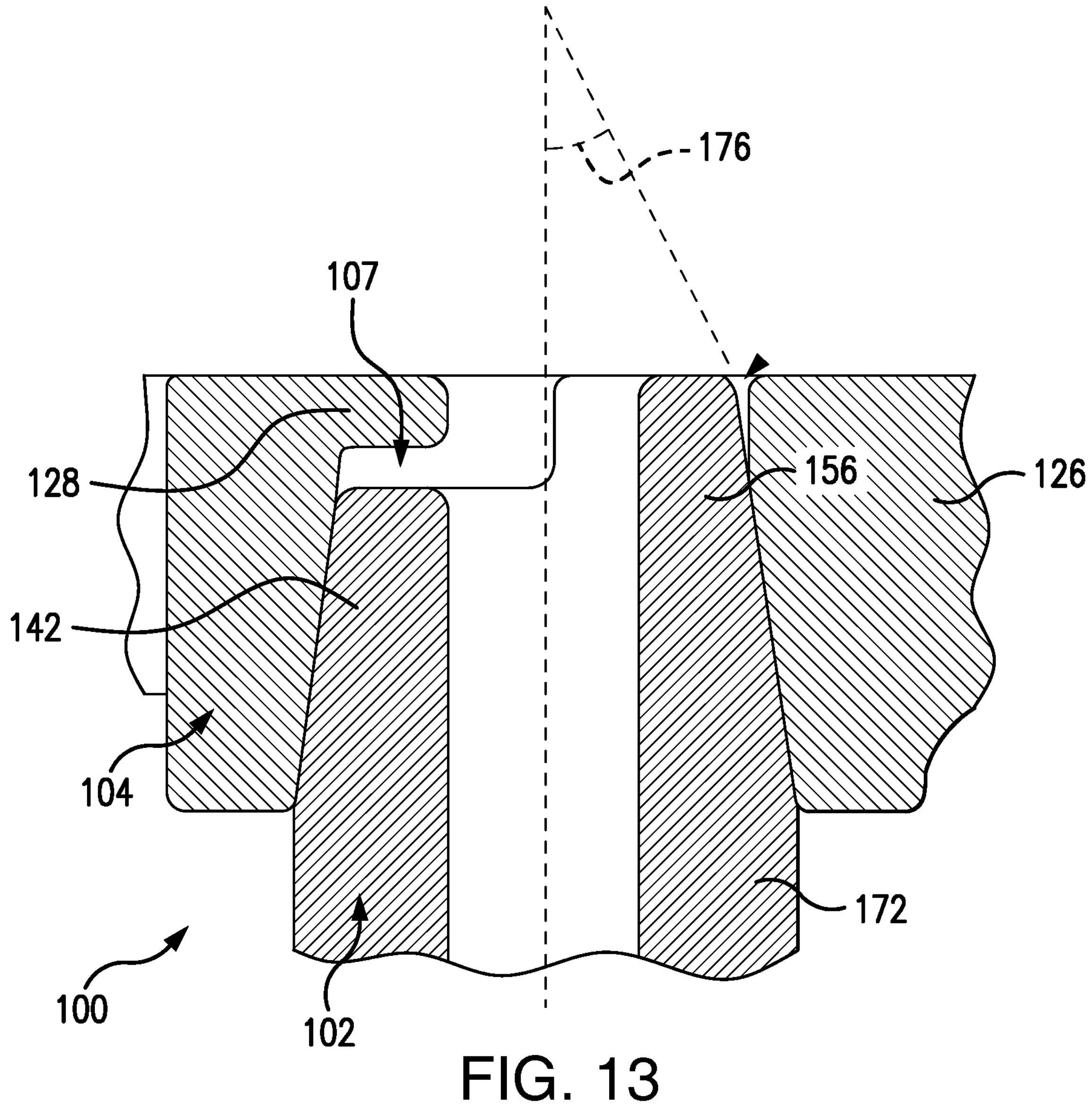

With reference to FIGS. 12 and 13, the support member 104 is shown seated on the shaft member 102. As shown in FIG. 12, the support member 104 seats on the shaft member 102 and about the rotation axis 74 such that the end facet 198 opposes the lower surface 110 (shown in FIG. 3) of the substrate support 106 (shown in FIG. 2). As shown in FIG. 13, it is contemplated that the support member 104 be registered relative to the shaft member 102 such that the end key segment 156 of shaft member 102 is slidably received within the end key socket 138 defined within the support member 104 and the frustoconical segment 142 shaft member 102 is slidably received within shaft socket 136 defined within the support member 104. It is further contemplated that the support member 104 be slidably received within the support member 104 such that the first circumferential facet 190 of the end key segment 156 of the shaft member 102 circumferentially opposes the first circumferential face 146 of the lug portion 128 of the support member 104, that the second circumferential facet 192 of the end key segment 156 of the shaft member 102 circumferentially opposes the second circumferential face 148 of the lug portion 128 of the support member 104, and that the socket facet 180 of frustoconical segment 142 of the shaft member 102 abut the interior surface 140 of the support member 104 bounding the shaft socket 136. In certain examples, the support member 104 may be axially located along the shaft member 102 such that the shaft aperture 132 axially overlaps the seating diameter 174 defined by the shaft member 102.

As will be appreciated by those of skill in the art in view of the present disclosure, abutting the socket facet 180 of shaft member 102 against the interior surface 140 of the support member 104 established level (e.g., tilt) of the support member 104 relative to the divider 64 (shown in FIG. 2), enabling control of tilt according tolerance of the manufacturing process used to define the shaft socket 136 and the socket facet 180 of the shaft member 102. Advantageously, as the socket facet 180 and the interior surface 140 of the hub structure 118 are circumferentially contiguous, such surfaces may be formed using a turning operation (such as using a lathe), simplifying fabrication of the shaft member 102 and the support member 104 while providing good tilt control. As will also be appreciated by those of skill in the art in of the present disclosure, transferring rotation between the shaft member 102 and the support member 104 via the circumferentially opposite first circumferential facet 190 of the shaft member 102 and the first circumferential face 146 of the support member 104 (or via the circumferentially opposite second circumferential facet 192 of the shaft member 102 and the second circumferential face 148 of the support member 104) may limit stress exerted on the transmissive material forming the shaft member 102, such as during acceleration to a predetermined material deposition rotational speed and/or during deceleration from the predetermined material layer deposition speed.

In certain examples, a radial gap 105 may be defined between the end key segment 156 of the shaft member 102 and the annular portion 126 of the support member 104. As will be appreciated by those of skill in the art in view of the present disclosure, this may simplify manufacture of the shaft member 102 and/or assembly of the process kit 100. In accordance with certain examples, an axial gap 107 may be defined between the lug portion 128 of the support member 104 and the frustoconical segment 142 of the shaft member 102. As will also be appreciated by those of skill in the art in view of the present disclosure, this can also simplify fabrication of support member 104 and/or assembly of the process kit.

With continuing reference to FIG. 12, either (or both) the first circumferential facet 190 and the second circumferential facet 192 of the shaft member 102 may have radial widths that are smaller than radial widths of the first circumferential face 146 and the second circumferential face 148 of the support member 104. In accordance with certain examples, the first circumferential facet 190 and the second circumferential facet 192 of the shaft member 102 may be defined on different diameters to control backlash between the shaft member 102 and the support member 104. In this respect the first circumferential facet 190 may be defined on a first diameter 101, the second circumferential facet 192 may be defined on a second diameter 103, and the second diameter 103 may be offset in rotation about the rotation axis 74 relative to the first diameter 101. Advantageously, the rotation offset between the second diameter 103 and the first diameter 101 may also facilitate removal of the support member 104 from the shaft member 102, for example, by employing the mass of the substrate support 106 (shown in FIG. 2) shift the support member 104 relative to the shaft member 102 by jogging the shaft member 102 in a direction opposite the direction of rotation employed during material layer deposition using the lift and rotate module 40 (shown in FIG. 2).

Figure 14:
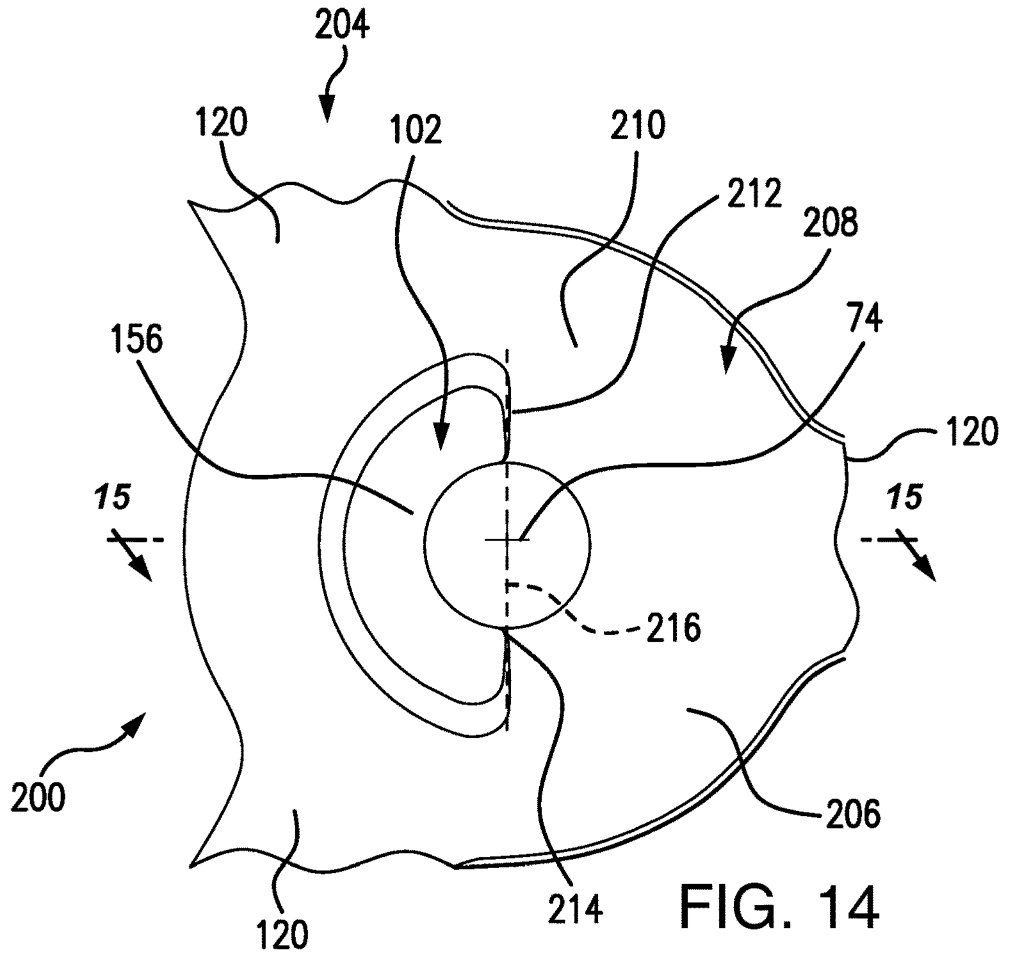
Figure 15:
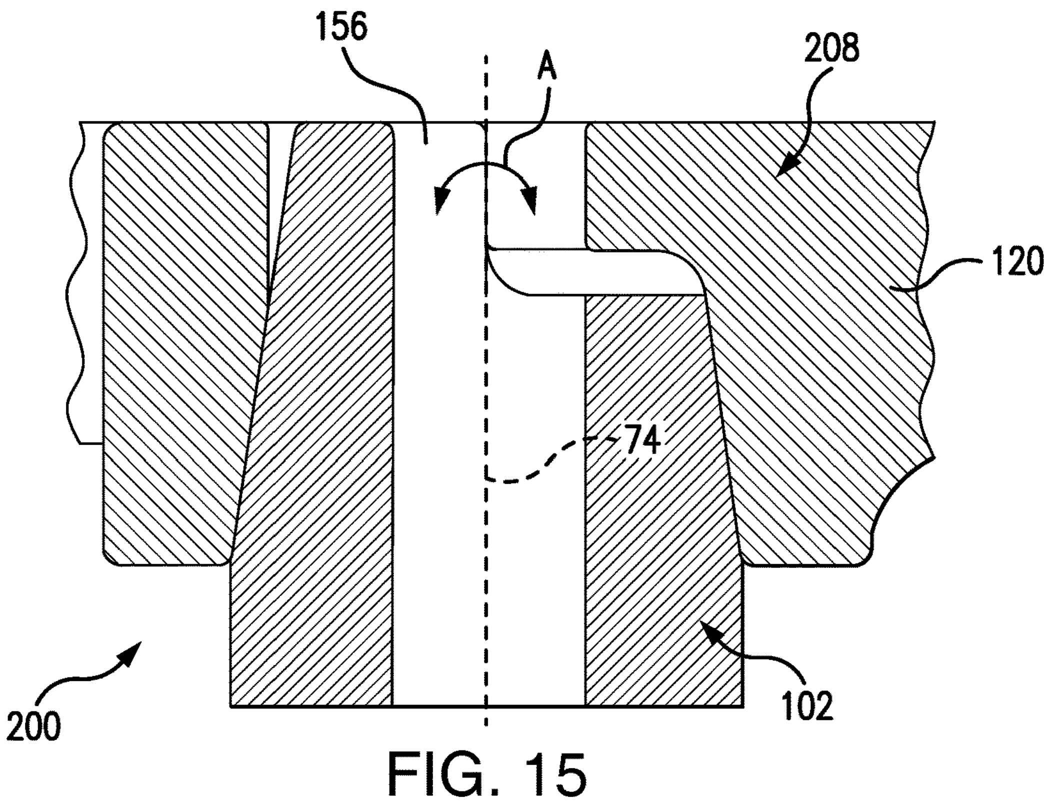

With reference to FIGS. 14 and 15, a process kit 200 including the shaft member 102 and a support member 204 are shown. The support member 204 is similar to the support member 104 (shown in FIG. 2) and additionally includes a hub structure 206. The hub structure 206 includes an annulus portion 208 and a lug portion 210. The lug portion 210 extends radially inward from the annulus portion 208 of the hub structure 206 at a location radially between one of the plurality of arm structures 120 and is this respect is radially aligned with one of the plurality of arm structures 120. Advantageously, radially aligning the lug portion 210 with one of the plurality of arm structures 120 may facilitate disassembly of the support member 204 from the shaft member 102, for example, by placing the end key segment 156 at a location the end key segment 156 opposes a force A that a maintainer may inadvertently exert on the support member 204 during removal of the support member 204 from the shaft member 102 that could otherwise potentially cause the shaft member 102 to be chipped during removal of support member 204.

As shown in FIG. 14, the support member 204 may further include first circumferential face 212 and a second circumferential face 214. The first circumferential face 212 and the second circumferential face 214 may be substantially parallel to one another and arranged along a chord 216 of the probe aperture 178, e.g., a chord 216 skew relative to the rotation axis 74. Advantageously, arranging the first circumferential face 212 and the second circumferential face 214 chordwise relative the probe aperture 178 may provide backlash control and simplify fabrication of the support member 204, for example, by eliminating the need to control the angular offset between the circumferential faces.

With reference to FIGS. 16 and 17, a process kit 300 is shown. The process kit 300 is similar to the process kit 300 and additionally includes the support member 104 and the shaft member 302. The shaft member 302 is similar to the shaft member 102 (shown in FIG. 2) and additionally includes an end key segment 304 with a radially outer arcuate facet 306 that is substantially parallel to a radially inner arcuate facet 308 of the end key segment 304. Advantageously, forming the end key segment 304 with the radially outer arcuate facet 306 that is substantially parallel to the radially inner arcuate facet 308 of the end key segment 304 may further limit the likelihood of damage to the shaft member 302 during removal of support member 104, for example, by limiting width of the radial gap 105 and thereby off-axis force components that a maintainer may inadvertently exert on the end key segment 304 during removal of the support member 104 from the shaft member 302.

With reference to FIG. 18, a method 400 of making a semiconductor processing system, e.g., the semiconductor processing system 10 (shown in FIG. 1), is shown. The method 400 includes registering a support member having an end key socket, e.g., the support member 104 (shown in FIG. 5) with the end key socket 138 (shown in FIG. 6), to an end key segment of a shaft member, e.g., the end key segment 156 (shown in FIG. 7) of the shaft member 102 (shown in FIG. 2), as shown with box 410. The method 400 also includes slidably seating the end key segment of the shaft member within the end key socket of the support member, as shown box 420. In this respect it is contemplated that the support member be translated relative to the shaft member along a rotation axis, e.g., the rotation axis 74 (shown in FIG. 2), defined by or about which the shaft member has been arranged. As shown with box 430, seating the support member onto the shaft member may include defining a radial gap, e.g., the radial gap 105 (shown in FIG. 15), between the end key segment and the hub structure of the support member. As shown with box 440, seating the support member onto the shaft member may include defining an axial gap, e.g., the axial gap 107 (shown in FIG. 15), between a frustoconical segment of the shaft member and a lug portion of the support member, e.g., between the frustoconical segment 142 (shown in FIG. 7) of the shaft member and the lug portion 128 (shown in FIG. 5) of the support member.

It is contemplated that the method 500 include rotationally fixing the support member relative the support member using the lug portion of the support member and the end key segment of the shaft member, as shown with box 450. Rotationally fixing the support member relative to the shaft member may include circumferentially opposing a first circumferential face of the support member to a first circumferential facet of the shaft member, e.g., opposing the first circumferential face 146 (shown in FIG. 5) of the support member to the first circumferential facet 190 (shown in FIG. 10) of the shaft member, as shown with box 452. Rotationally fixing the support member relative to the shaft member may include circumferentially opposing a second circumferential face of the support member to a second circumferential facet of the shaft member, e.g., opposing the second circumferential face 148 (shown in FIG. 5) of the support member to the second circumferential facet 192 (shown in FIG. 10) of the shaft member, as shown with box 454. Rotational fixation may be accomplished by thereafter bringing either the first circumferential face of the support member into abutment with the first circumferential facet of the shaft member, the second circumferential face of the support member into abutment with the second circumferential facet of the shaft, or both the first circumferential face into abutment with the first circumferential face and the second circumferential face into abutment the second circumferential facet, as shown with box 456 and box 458.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A shaft member, comprising:

a cylindrical body formed from a ceramic material having:

a drive segment extending about a rotation axis;

a frustoconical segment axially offset from the drive segment; and an end key segment extending axially from the frustoconical segment and axially separated from the drive segment by the frustoconical segment of the cylindrical body, wherein the end key segment has a first circumferential facet and a second circumferential facet circumferentially opposite the first circumferential facet to fix the shaft member in rotation about the rotation axis relative to a support member seated on the shaft member when the end key segment is slidably received within an end key socket defined within the support member.

2. The shaft member of claim 1, wherein the cylindrical body of the shaft member defines a probe aperture extending axially between the drive segment and the end key segment of the cylindrical body, wherein the first circumferential facet and the second circumferential facet are radially offset from the probe aperture.

3. The shaft member of claim 2, further comprising a probe member slidably received within the probe aperture and extending axially from the end key segment of the shaft member and in a direction axially opposite the frustoconical segment of the shaft member.

4. The shaft member of claim 1, wherein the ceramic material forming the cylindrical body of the shaft member is quartz, fused silica, or sapphire.

5. The shaft member of claim 1, wherein the frustoconical segment of the shaft member defines a frustoconical facet extending circumferentially about the rotation axis and tapering axially between the drive segment and the end key segment of the shaft member.

6. The shaft member of claim 1, wherein the frustoconical segment of the shaft member defines a frustoconical segment taper angle that is between about 15 degrees and about 65 degrees relative to the rotation axis.

7. The shaft member of claim 6, wherein the end key segment of the shaft member has an end facet substantially orthogonal relative to the rotation axis, a radially inner arcuate facet substantially parallel to the rotation axis, and a radially outer arcuate facet radially separated from the radially inner arcuate facet by the end facet.

8. The shaft member of claim 7, wherein the radially outer arcuate facet is substantially parallel to the radially inner arcuate facet.

9. The shaft member of claim 7, wherein the radially outer arcuate facet is oblique relative to the radially inner arcuate facet.

10. The shaft member of claim 1, wherein the first circumferential facet of the end key segment is substantially parallel to the second circumferential facet of the end key segment.

11. The shaft member of claim 1, wherein the first circumferential facet and the second circumferential facet are arranged along a common diameter, the common diameter intersecting the rotation axis, the first circumferential facet and the second circumferential facet parallel to the common diameter.

12. The shaft member of claim 1, wherein the first circumferential facet and the second circumferential facet are arranged along a first diameter and a second diameter, the first diameter and the second diameter intersecting the rotation axis, the second diameter circumferentially offset about the rotation axis from the first diameter.

13. A process kit, comprising:
- a support member, comprising:
  - a hub structure defining a shaft socket and an end key socket;
  - a plurality of arm portions extending radially from the hub structure; and
  - a plurality of finger structures connected to the hub structure by the plurality of arm portions and extending axially from the plurality of arm portions;
- a shaft member as recited in claim 1;
- wherein the support member is formed from the ceramic material forming the shaft member;
- wherein the frustoconical segment of the shaft member is slidably received within the shaft socket of the support member to fix the support member axially along the rotation axis; and
- wherein the end key segment of the shaft member is slidably received within the end key socket of the support member to fix the support member relative to the shaft member in rotation about the rotation axis.

14. The process kit of claim 13, wherein the end key socket has a first circumferential face and a second circumferential face circumferentially spaced apart from one another about the rotation axis, wherein the first circumferential face of the end key socket circumferentially opposes the first circumferential facet of the shaft member, and wherein the second circumferential face of the end key socket circumferentially opposes the second circumferential facet of the shaft member.

15. The process kit of claim 14, wherein the first circumferential facet has a facet radial width, wherein the first circumferential face has a face radial width, and wherein the face radial width is greater than the facet radial width.

16. The process kit of claim 13, wherein the hub structure has an annulus portion extending circumferentially about the rotation axis and a lug portion extending radially toward the rotation axis, the lug portion overlying and spaced apart from the frustoconical segment of the shaft member, the lug portion bounding an end key aperture and abutting the end key segment of the shaft member.

17. The process kit of claim 16, wherein the end key segment of the shaft member is radially separated from the hub structure within the end key socket.

18. The process kit of claim 16, wherein an interior surface of the hub structure has an annular segment bounding the end key socket, the annular segment opposing a radially outer facet of the end key segment.

19. A semiconductor processing system, comprising:
- a precursor delivery arrangement including a silicon-containing material layer precursor;
- a chamber arrangement connected to the precursor delivery arrangement with a process kit including a shaft member as recited in claim 1, a support member seated on the shaft member, and a substrate support seated on the support member;
- wherein the support member is formed from quartz;
- wherein the ceramic material forming the shaft member is quartz; and
- wherein the frustoconical segment of the shaft member defines a frustoconical segment taper angle between about 15 degrees and about 65 degrees relative to the rotation axis.

20. A method of making a semiconductor processing system, comprising:
- at a shaft member including a cylindrical body formed from a ceramic material and having a drive segment extending about a rotation axis, a frustoconical segment axially offset from the drive segment, and an end key segment extending axially from the frustoconical segment and axially separated from the drive segment by the frustoconical segment of the cylindrical body, the end key segment having a first circumferential facet and a second circumferential facet circumferentially opposite the first circumferential facet;
- registering a support member having an end key socket to the end key segment of the shaft member in rotation about the rotation axis;
- slidably seating the end key segment of the shaft member within the end key socket of the support member; and
- rotationally fixing the support member relative to the shaft member by abutting the first circumferential facet against a first circumferential face of the support member.

* * * * *